United States Patent
Do et al.

(10) Patent No.: US 8,298,909 B2
(45) Date of Patent: Oct. 30, 2012

(54) SEMICONDUCTOR DEVICE AND METHOD FOR FABRICATING THE SAME

(75) Inventors: Kwan-Woo Do, Ichon-shi (KR);
Jae-Sung Roh, Ichon-shi (KR);
Kee-Jeung Lee, Ichon-shi (KR);
Deok-Sin Kil, Ichon-shi (KR);
Young-Dae Kim, Ichon-shi (KR);
Jin-Hyock Kim, Ichon-shi (KR);
Kyung-Woong Park, Ichon-shi (KR);
Han-Sang Song, Ichon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 672 days.

(21) Appl. No.: 11/965,016

(22) Filed: Dec. 27, 2007

(65) Prior Publication Data
US 2008/0157278 A1    Jul. 3, 2008

(30) Foreign Application Priority Data

Dec. 27, 2006  (KR) .................. 10-2006-0134290
Oct. 1, 2007  (KR) .................. 10-2007-0098562

(51) Int. Cl.
*H01L 21/20* (2006.01)
*H01L 21/02* (2006.01)

(52) U.S. Cl. ................. 438/396; 438/399; 257/E21.008

(58) Field of Classification Search .................. 438/396, 438/399
See application file for complete search history.

(56) References Cited

U.S. PATENT DOCUMENTS

| | | | |
|---|---|---|---|
| 5,864,153 A | 1/1999 | Nagel et al. | |
| 6,872,995 B2 | 3/2005 | Hase | |
| 7,018,933 B2 | 3/2006 | Kim et al. | |
| 7,229,917 B2 | 6/2007 | Umehara et al. | |
| 7,271,054 B2 | 9/2007 | Hase | |
| 2004/0041194 A1* | 3/2004 | Marsh | 257/306 |
| 2004/0235260 A1* | 11/2004 | Lee et al. | 438/396 |
| 2005/0238808 A1* | 10/2005 | Gatineau et al. | 427/248.1 |

FOREIGN PATENT DOCUMENTS

| | | |
|---|---|---|
| CN | 1309814 | 8/2001 |
| CN | 1093319 C | 10/2002 |
| CN | 1176245 C | 11/2004 |
| CN | 1215549 C | 8/2005 |
| KR | 1020020002722 A | 1/2002 |
| KR | 1020040039982 A | 5/2004 |
| KR | 1020040085805 A | 10/2004 |
| KR | 1020050122426 A | 12/2005 |
| KR | 1020060104507 A | 10/2006 |
| KR | 100770276 B1 | 10/2007 |
| KR | 1020090022808 A | 3/2009 |

* cited by examiner

*Primary Examiner* — Charles Garber
*Assistant Examiner* — Calvin Choi
(74) *Attorney, Agent, or Firm* — Kilpatrick Townsend & Stockton LLP

(57) ABSTRACT

A capacitor includes a lower electrode, a dielectric layer, an upper electrode, and a ruthenium oxide layer. At least one of the lower electrode and the upper electrode is formed of a ruthenium layer, and the ruthenium oxide layer is disposed next to the ruthenium layer.

24 Claims, 13 Drawing Sheets

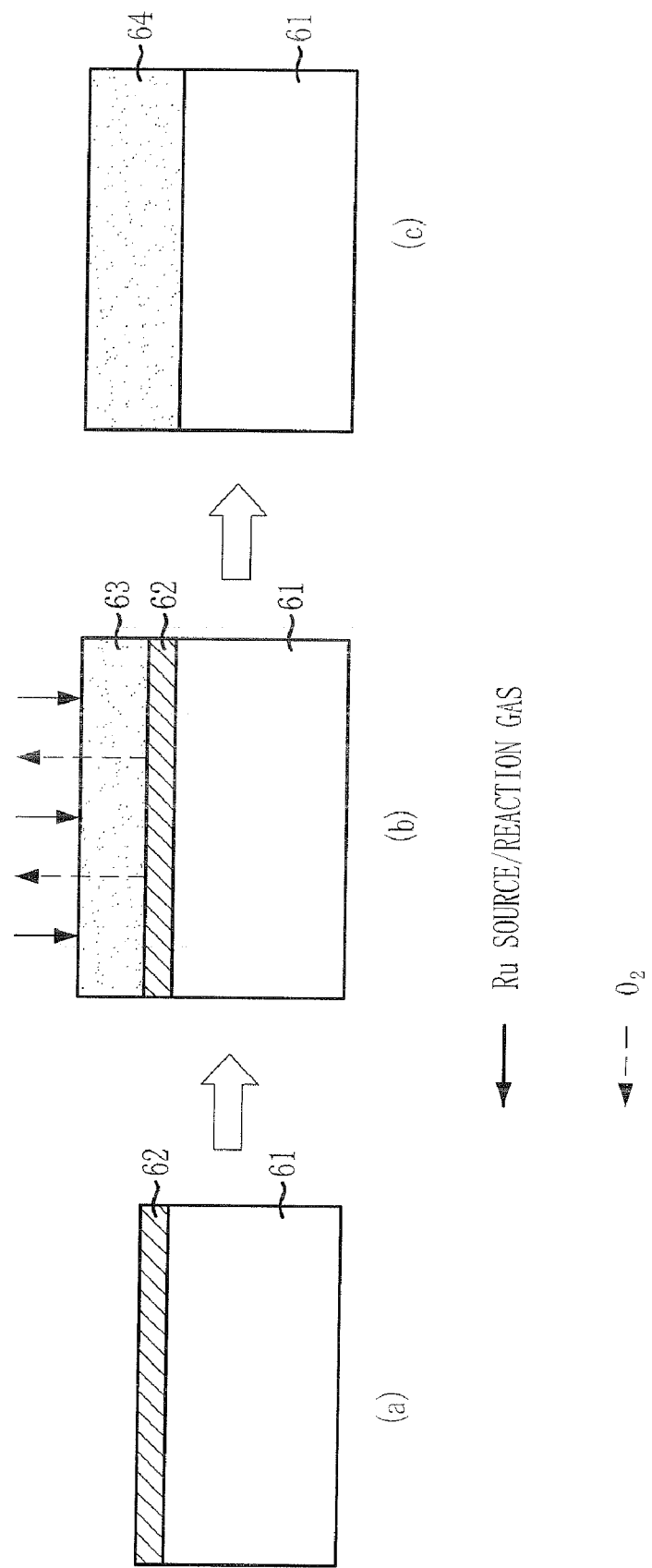

FIG. 8
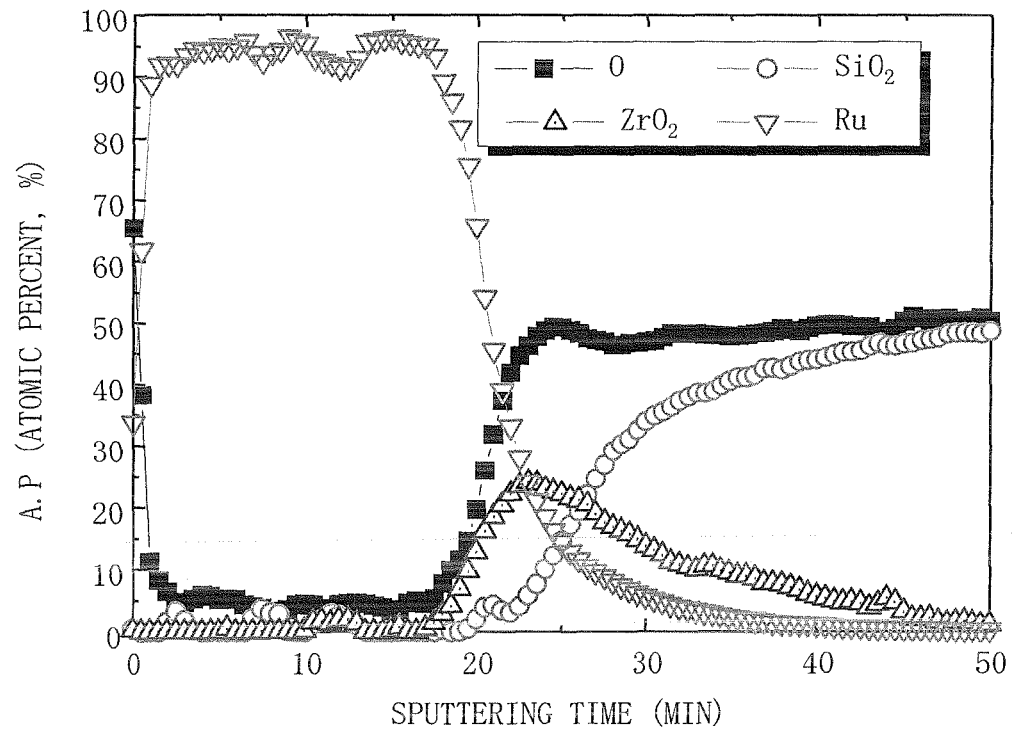
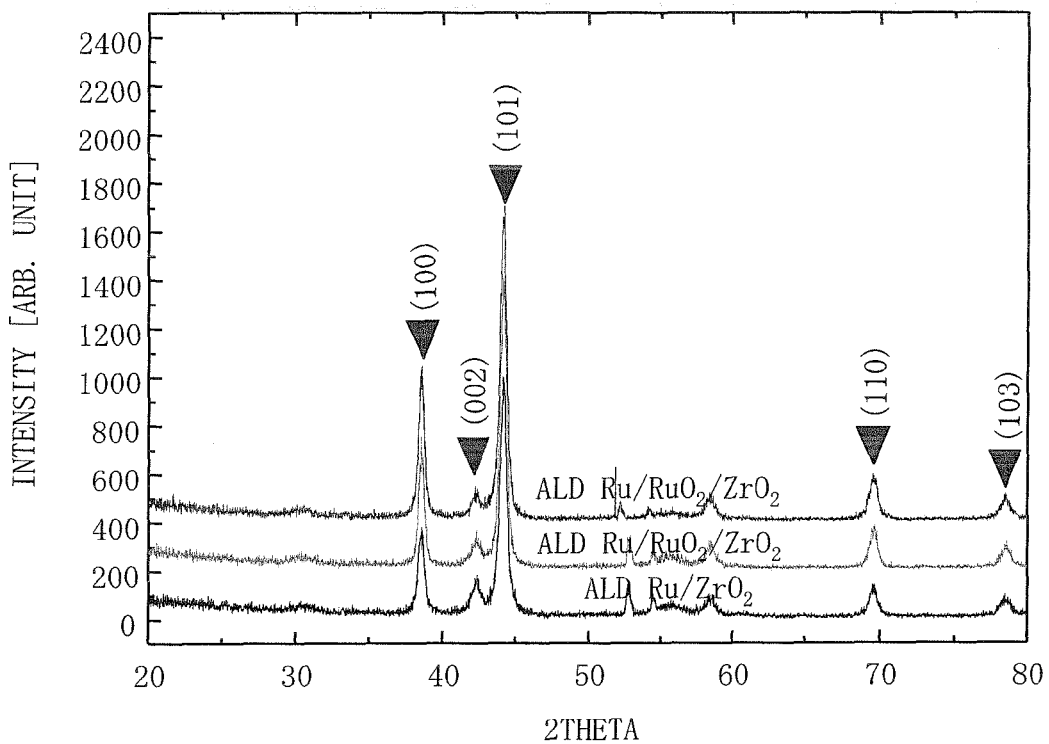

US 8,298,909 B2

SEMICONDUCTOR DEVICE AND METHOD FOR FABRICATING THE SAME

CROSS-REFERENCE TO RELATED APPLICATIONS

The present invention claims priority of Korean patent application numbers 10-2006-0134290 and 10-2007-0098562, filed on Dec. 27, 2006, and Oct. 1, 2007, respectively, which are incorporated by reference in their entirety.

BACKGROUND OF THE INVENTION

The present invention relates to a method for fabricating a capacitor of a semiconductor device, and more particularly, to a capacitor including a metal layer such as a ruthenium (Ru) layer that is used for a lower or an upper electrode, and a method for fabricating the capacitor.

In general, a capacitor used in a memory cell may include a lower electrode for storage, a dielectric layer, and an upper electrode for a plate. The capacitance of the capacitor can be increased by, for example, reducing a thickness of the dielectric layer, forming the capacitor into a three-dimensional shape to increase the effective area of the capacitor, or using a high-permittivity dielectric material such as tantalum pentoxide ($Ta_2O_5$) for the dielectric layer without increasing a size of the capacitor.

When the lower electrode is formed of polysilicon, it is difficult to use $Ta_2O_5$ for forming the dielectric layer since the lower electrode formed of polysilicon oxidizes when a high-temperature heat treatment is performed on the dielectric layer formed of $Ta_2O_5$. In this case, the effective thickness of the dielectric layer increases, and the capacitance of the capacitor decreases. Furthermore, the electric characteristics of the capacitor deteriorate due to variations in the current output of the capacitor caused by asymmetric current-voltage characteristics of the capacitor.

Therefore, in the field of under 0.1 μm technology, the lower electrode is formed of a metal such as ruthenium instead of polysilicon. For example, a metal-insulator-metal (MIM) capacitor or a metal-insulator-polysilicon (MIP) capacitor has been introduced. The MIM capacitor can be fabricated by sequentially stacking a lower electrode metal layer, a dielectric layer, and an upper electrode metal layer on a substrate after the substrate is processed. The lower electrode metal layer and the upper electrode metal layer can be formed of ruthenium layers having a low resistivity. The ruthenium layers are generally formed by atomic layer deposition (ALD) due to a large height difference in a structure of the MIM capacitor.

However, a ruthenium layer deposited on a substrate by ALD is not firmly bonded to the substrate since the ruthenium layer exhibits poor adhesiveness although the adhesiveness of the ruthenium layer can be improved depending on the kind of the substrate. Therefore, contact defects such as a blister can be formed between the ruthenium layer and the substrate.

FIG. 1 illustrates a ruthenium layer 13 of a conventional MIM capacitor. Referring to FIG. 1, when the ruthenium layer 13 is formed on a structure in which a TiN layer 11 and a $TiO_2$ layer 12 are sequentially formed, the ruthenium layer 13 can be removed from the structure. In this case, a blister 14 may be formed between the ruthenium layer 13 and the structure, making it difficult to fabricate the capacitor and deteriorating the characteristics of the capacitor, such as a capacitance and a leakage current.

Therefore, when a capacitor is fabricated using a ruthenium layer having a low resistivity as a lower or an upper electrode, it is necessary to firmly bond the ruthenium layer to a substrate or other layers.

SUMMARY OF THE INVENTION

Embodiments of the present invention are directed to providing a capacitor suitable for fabrication and having good electric characteristics by increasing an adhesiveness of a ruthenium layer of the capacitor, and a method for fabricating the capacitor.

In accordance with an aspect of the present invention, a capacitor includes a lower electrode, an upper electrode, a dielectric layer between the lower electrode and the upper electrode, and a ruthenium oxide layer. At least one of the lower electrode and the upper electrode is formed of a ruthenium layer, and the ruthenium oxide layer is disposed adjacent to the ruthenium layer between the lower electrode and the upper electrode.

In accordance with another aspect of the present invention, a method for fabricating a capacitor includes forming a first ruthenium oxide layer over a substrate; forming a lower electrode ruthenium layer for a lower electrode on the first ruthenium oxide layer; forming a dielectric layer over the lower electrode ruthenium layer; and forming an upper electrode conduction layer for an upper electrode over the dielectric layer.

BRIEF DESCRIPTION OF THE DRAWINGS

FIG. 6 illustrates reduction of a ruthenium oxide layer when a ruthenium layer is deposited on the ruthenium oxide layer.

FIG. 8 illustrates reduction of a ruthenium oxide layer when a ruthenium layer is deposited on the ruthenium oxide layer.

DESCRIPTION OF SPECIFIC EMBODIMENTS

A capacitor and a method for fabricating the same in accordance with the present invention will be described in detail with reference to the accompanying drawings.

Figure 1:
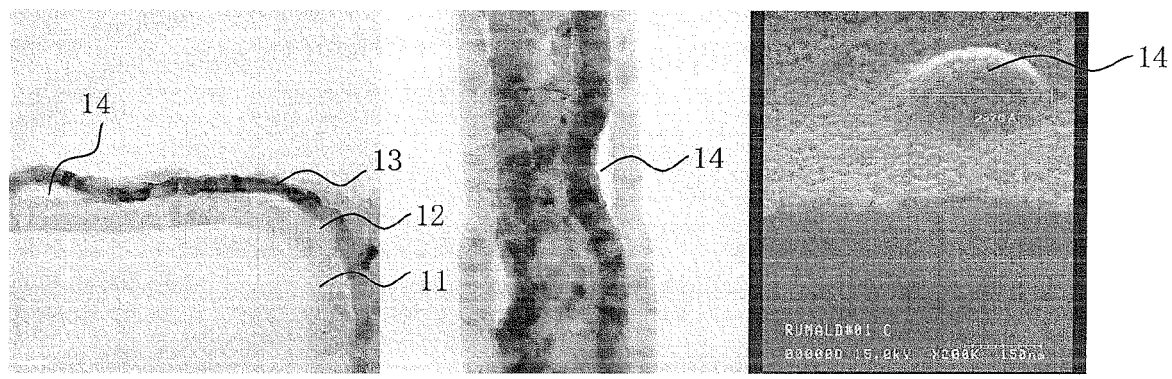
FIG. 1 illustrates a ruthenium layer of a conventional metal-insulator-metal (MIM) capacitor.
Figure 2:
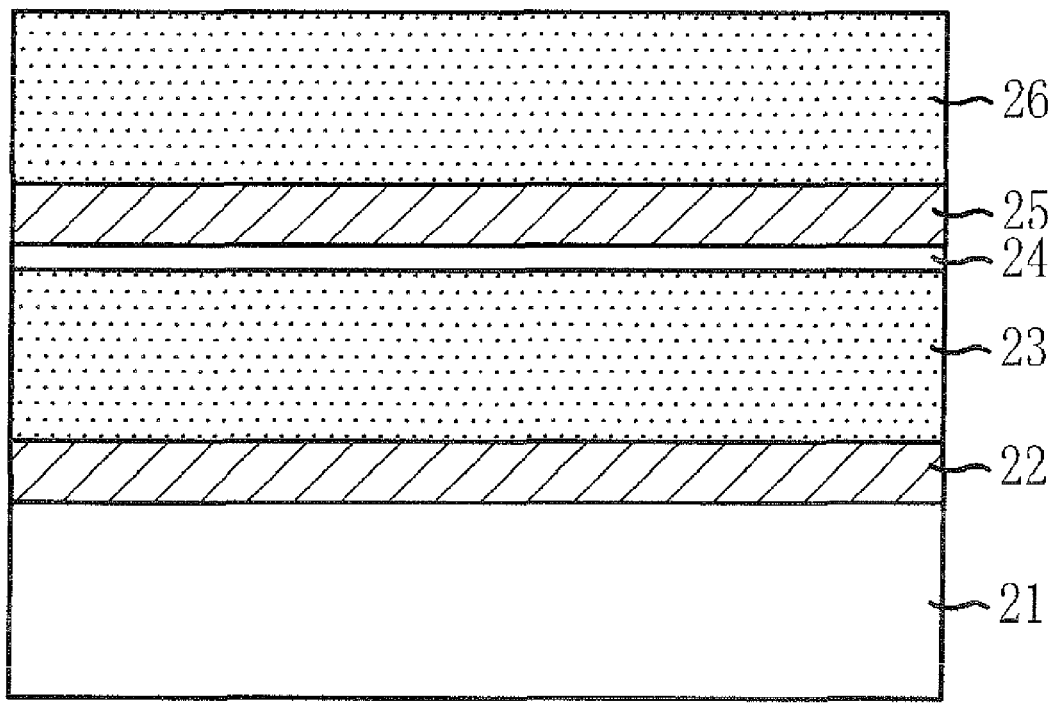
FIG. 2 illustrates a cross-sectional view of a capacitor in accordance with a first embodiment of the present invention.

FIG. 2 illustrates a cross-sectional view of a capacitor in accordance with an embodiment of the present invention.

Referring to FIG. 2, a first ruthenium ($RuO_2$) oxide layer 22 is formed on a substrate 21. Since the first ruthenium oxide layer 22 is highly adhesive, the first ruthenium oxide layer 22 functions as an adhesive layer to increase a bond between the substrate 21 and a lower electrode ruthenium layer 23 that will formed in a subsequent process.

The lower electrode ruthenium layer 23 is formed on the first ruthenium oxide layer 22. A dielectric layer 24 is formed on the lower electrode ruthenium layer 23. An upper electrode will be formed above the dielectric layer 24 for forming the capacitor. When a ruthenium layer is used as a metal layer for the upper electrode, a ruthenium oxide layer can be formed between the dielectric layer 24 and the ruthenium layer to increase a bond between the dielectric layer 24 and the ruthenium layer. This is similar to the case of forming the first ruthenium oxide layer 22 between the substrate 21 and the lower electrode ruthenium layer 23 to increase a bond between the substrate 21 and the lower electrode ruthenium layer 23. Specifically, a second ruthenium oxide layer 25 is formed on the dielectric layer 24, and an upper electrode ruthenium layer 26 is formed on the second ruthenium oxide layer 25.

In this case, since the highly adhesive ruthenium oxide layers 22 and 25 are disposed under the ruthenium layers 23 and 26, the capacitor can be easily fabricated, and the electric characteristics of the capacitor can be improved.

A method for depositing a ruthenium layer by atomic layer deposition (ALD) and a method for depositing a ruthenium oxide layer by ALD will now be described with reference to FIGS. 3 and 4, and a method for fabricating a capacitor will be described in accordance with a first embodiment of the present invention.

Figure 3:
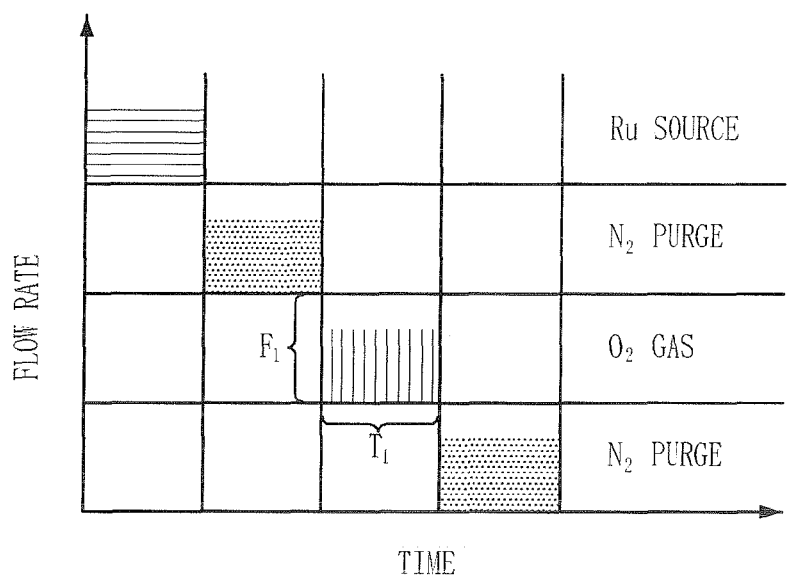
FIG. 3 illustrates a method for forming a ruthenium layer by atomic layer deposition (ALD).
Figure 4:
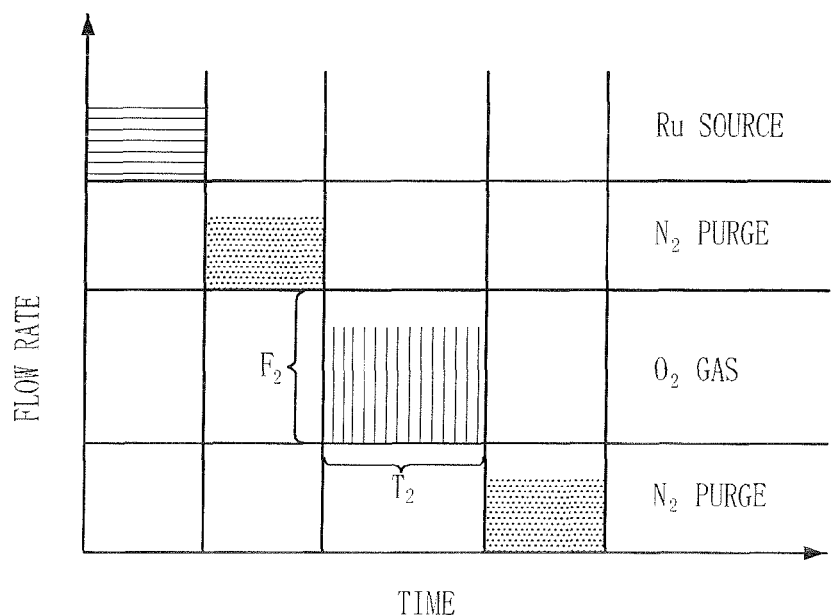
FIG. 4 illustrates a method for forming a ruthenium oxide layer by ALD.

FIG. 3 illustrates a method for depositing a ruthenium layer by ALD and FIG. 4 illustrates a method for depositing a ruthenium oxide layer by ALD.

Referring to FIG. 3, the method for depositing a ruthenium layer by ALD may include a first process for injecting a ruthenium source into a reaction chamber, a second process for purging the reaction chamber using $N_2$ gas, a third process for injecting reaction gas containing $O_2$ or $O_3$ into the reaction chamber, and a fourth process for purging the reaction chamber using $N_2$ gas to remove inactive gas that does not participate in a reaction.

A cycle of the first to fourth processes can be repeated to deposit a uniform thin layer to a given thickness. The $O_2$ or $O_3$ gas contained in the reaction gas is not formed into a component of the ruthenium layer. Instead, the $O_2$ or $O_3$ facilitates decomposition of the ruthenium source and formation of the ruthenium layer.

Referring to FIG. 4, the method for depositing a ruthenium oxide layer by ALD is the same as the method explained in FIG. 3, except for a reaction gas injection rate and time in the third process.

In the third process explained in FIG. 3, a reaction gas injection flow rate F1 or an injection time T1 is kept below a critical level so as to deposit a ruthenium layer that does not include oxygen. However, in the third process of FIG. 4, a reaction gas injection flow rate F2 or an injection time T2 is greater than the reaction gas injection flow rate F1 or the injection time T1 so that a ruthenium oxide layer including oxygen can be deposited.

Based on the above-described methods for depositing a ruthenium layer and a ruthenium oxide layer, a method for fabricating a capacitor will now be described in accordance with a first embodiment of the present invention.

FIGS. 5A to 5G illustrate a method for fabricating a capacitor in accordance with a first embodiment of the present invention. Although a cylindrical capacitor is used to explain the method in accordance with the current embodiment of the present invention, the present invention is not limited to the cylindrical capacitor. For example, the method in accordance with the present invention can be applied to fabricating a flat or concave capacitor.

Figure 5A:
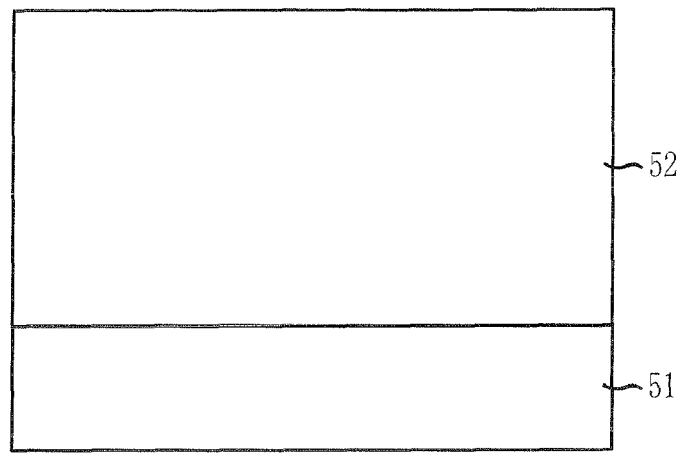
FIGS. 5A to 5G illustrate a method for fabricating a capacitor in accordance with the first embodiment of the present invention.

Referring to FIG. 5A, a mold oxide layer 52 is formed on a substrate 51 including a lower structure. The mold oxide layer 52 can be formed to a thickness of approximately 1.5 μm. A nitride layer (not shown) can be formed under the mold oxide layer 52 as an etch stop layer.

Figure 5B:
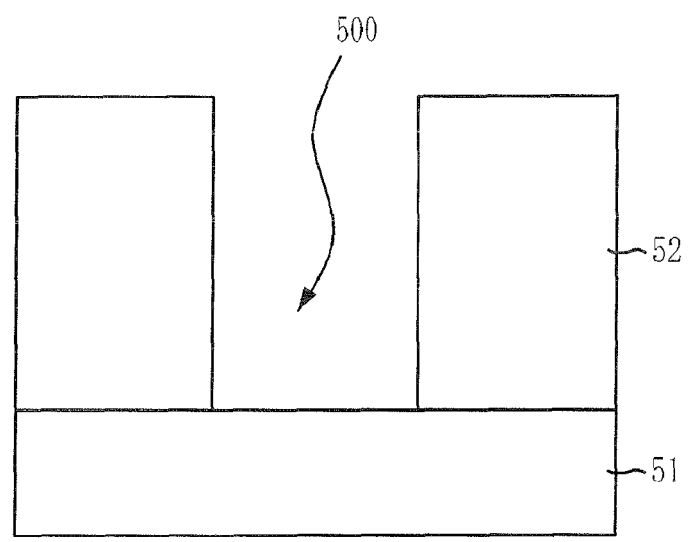

Referring to FIG. 5B, the mold oxide layer 52 is selectively etched to expose a portion of the substrate 51 (for example, a storage node contact) so as to define a capacitor region 500. When an etch stop layer is formed under the mold oxide layer 52, both the mold oxide layer 52 and the etch stop layer are selectively etched. For example, the capacitor region 500 can have a width of approximately 150 nm and a depth of approximately 1.5 μm.

Figure 5C:
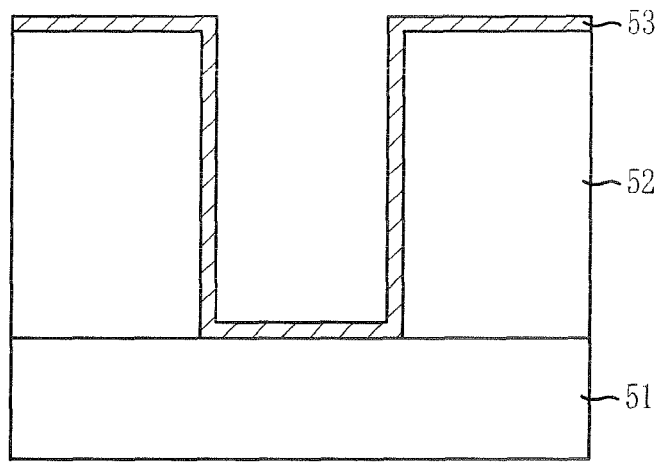

Referring to FIG. 5C, a first ruthenium oxide layer 53 is deposited on an entire surface of the mold oxide layer 52 including the capacitor region 500. The first ruthenium oxide layer 53 increases a bond between the substrate 51 and a lower electrode ruthenium layer 54 (refer to FIG. 5D) that will be formed in a subsequent process.

The first ruthenium oxide layer 53 can be deposited by the method explained in FIG. 4. That is, a cycle of the first to fourth processes explained in FIG. 4 can be repeated to deposit the first ruthenium oxide layer 53 to a given thickness. As explained above, the injection flow rate F2 or injection time T2 of the reaction gas including $O_2$ or $O_3$ is kept equal to or greater than a given critical value in the third process.

More specifically, the first ruthenium oxide layer 53 may be deposited in a temperature range from approximately 200° C. to approximately 400° C. or at a pressure ranging from approximately 3 torr to approximately 4 torr. The method of depositing the first ruthenium oxide layer 53 may include: a first process in which a ruthenium source is injected at a flow rate of approximately 50 sccm to approximately 500 sccm for approximately 0.1 sec to approximately 10 sec; a second process in which $N_2$ gas is injected at a flow rate of approximately 100 sccm to approximately 900 sccm for approximately 1 sec to approximately 5 sec; a third process in which $O_2$ gas is injected at a flow rate of approximately 200 sccm to approximately 1,000 sccm for approximately 1 sec to approximately 10 sec; and a fourth process in which $N_2$ gas is injected at a flow rate of approximately 100 sccm to approximately 900 sccm for approximately 1 sec to approximately 5 sec. In the third process, reaction gas including $O_2$ or $O_3$ gas can be used. The reaction gas may further include one or more of $H_2O$, $NH_3$, and $H_2$.

Figure 5D:
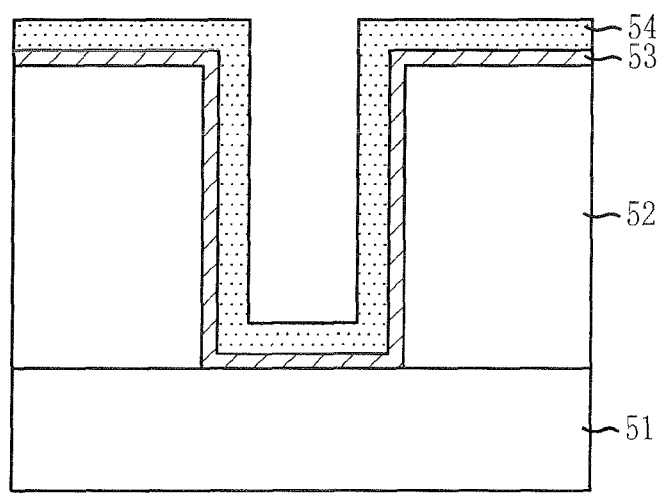

Referring to FIG. 5D, the lower electrode ruthenium layer 54 is deposited on the first ruthenium oxide layer 53. Since the lower electrode ruthenium layer 54 is deposited on the first ruthenium oxide layer 53 that is highly adhesive, a blister may not be formed between the first ruthenium oxide layer 53 and the lower electrode ruthenium layer 54.

The lower electrode ruthenium layer 54 can be deposited by the method explained with reference to FIG. 3. That is, a cycle of the first to fourth processes explained with reference to FIG. 3 can be repeated to deposit the lower electrode ruthenium layer 54. As explained above, the injection flow rate F1 or injection time T1 of the reaction gas including $O_2$ or $O_3$ is kept equal to or smaller than a critical value in the third process. For example, the injection flow rate F2 or injection time T2 of the reaction gas used for forming the first ruthenium oxide layer 53 may be two or more times the injection flow rate F1 or injection time T1 of the reaction gas used for forming the lower electrode ruthenium layer 54.

More specifically, the lower electrode ruthenium layer 54 may be deposited in a temperature range from approximately 200° C. to approximately 400° C. or at a pressure ranging from approximately 3 torr to approximately 4 torr. The method of depositing the lower electrode ruthenium layer 54 may include: a first process in which a ruthenium source is injected at a flow rate of approximately 50 sccm to approximately 500 sccm for approximately 0.1 sec to approximately 10 sec; a second process in which $N_2$ gas is injected at a flow rate of approximately 100 sccm to approximately 900 sccm for approximately 1 sec to approximately 5 sec; a third process in which $O_2$ gas is injected at a flow rate of approximately 200 sccm to approximately 1,000 sccm for approximately 1 sec to approximately 10 sec; and a fourth process in which $N_2$ gas is injected at a flow rate of approximately 100 sccm to approximately 900 sccm for approximately 1 sec to approximately 5 sec. When the method for depositing the first ruthenium oxide layer 53 is compared with the method for depositing the lower electrode ruthenium layer 54, the flow rate or injection time of $O_2$ gas in the third process of the method for depositing the first ruthenium oxide layer 53 is larger than (for example, twice larger than) the flow rate or injection time of $O_2$ gas in the third process of the method for depositing the lower electrode ruthenium layer 54. In the third process, reaction gas including $O_2$ or $O_3$ gas can be used. The reaction gas may further include one or more of $H_2O$, $NH_3$, and $H_2$.

The first ruthenium oxide layer 53 and the lower electrode ruthenium layer 54 can be formed in-situ.

Figure 5E:
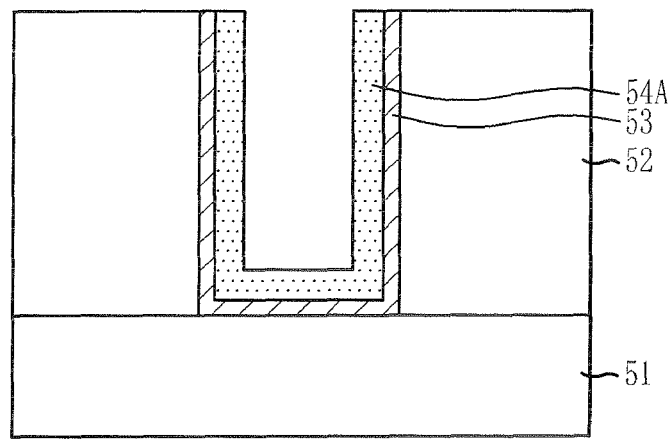

Referring to FIG. 5E, chemical mechanical polishing (CMP) or etchback is performed until the mold oxide layer 52 is exposed, thereby separating a node of the lower electrode ruthenium layer 54. Hereinafter, the lower electrode ruthenium layer 54 of which nodes are separated will be denoted as a lower ruthenium electrode 54A.

Figure 5F:
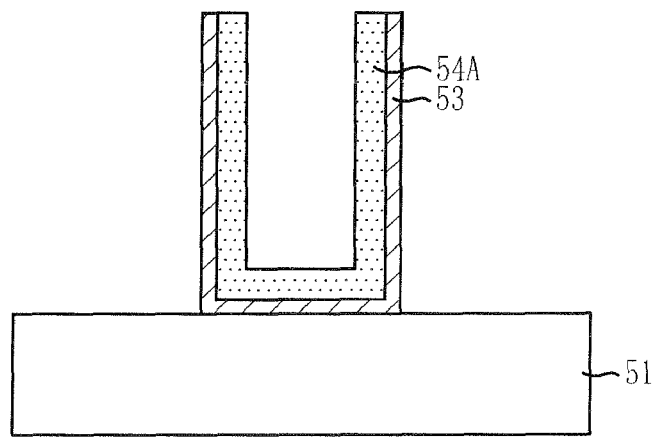

Referring to FIG. 5F, a wet etch process is performed using a buffered oxide etchant (BOE) to remove the mold oxide layer 52 so that the lower ruthenium electrode 54A can be formed into a cylindrical shape. The wet etch process is performed to form a cylindrical capacitor in accordance with an embodiment of the present invention. That is, the wet etch process can be omitted when other types of capacitors are formed. For example, when the wet etch process is omitted, a concave capacitor can be formed.

Figure 5G:
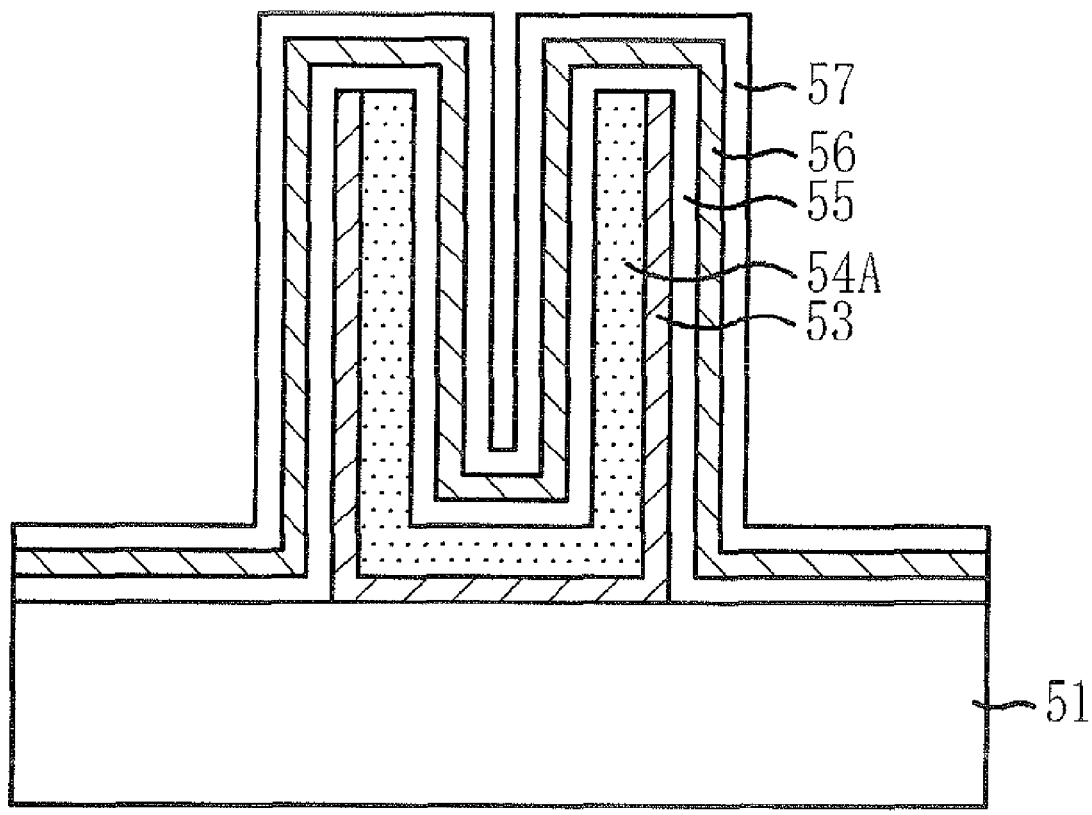

Referring to FIG. 5G, a dielectric layer 55 is deposited on a structure including the lower ruthenium electrode 54A. The dielectric layer 55 is an insulation layer formed of a material having a high permittivity. The dielectric layer 55 can be formed by ALD.

A second ruthenium oxide layer 56 is deposited on the dielectric layer 55 as an adhesive layer to increase a bond between the dielectric layer 55 and an upper electrode ruthenium layer 57 that will be formed in a subsequent process. The second ruthenium oxide layer 56 can be deposited in the same process as the deposition process for the first ruthenium oxide layer 53.

The upper electrode ruthenium layer 57 is deposited on the second ruthenium oxide layer 56. The upper electrode ruthenium layer 57 can be deposited in the same process as the deposition process for the lower electrode ruthenium layer 54.

In this way, the ruthenium layer having a low resistivity can be used for the upper or lower electrode since the ruthenium layer can be firmly attached to other layers using the ruthenium oxide layer, thereby increasing the electric characteristics of the capacitor. Moreover, the ruthenium oxide layer used as an adhesive layer, and the ruthenium layer for an electrode can be formed in situ so that process time and costs can be reduced.

In the method for fabricating a capacitor in accordance with the first embodiment of the present invention, when the lower electrode ruthenium layer 54 is deposited on the first ruthenium oxide layer 53, the first ruthenium oxide layer 53 can be partially converted into ruthenium through chemical reduction by the ruthenium source and the reaction gas. In this case, the electrical characteristics of the capacitor can be improved. This feature will now be described in more detail with reference to FIGS. 6 and 7.

FIG. 6 illustrates reduction of a ruthenium oxide layer 62 when a ruthenium layer 63 is deposited on the ruthenium oxide layer 62.

Referring to (a) in FIG. 6, a ruthenium oxide layer 62 is deposited on a substrate 61 using the same method used for depositing the first ruthenium oxide layer 53.

Referring to (b) in FIG. 6, the ruthenium layer 63 is deposited on the ruthenium oxide layer 62 using the same method used for depositing the lower electrode ruthenium layer 54.

When the ruthenium layer 63 is deposited on the ruthenium oxide layer 62, oxygen included in the ruthenium oxide layer 62 is removed by a ruthenium source and reaction gas. That is, the ruthenium oxide layer 62 undergoes chemical reduction. The degree of the chemical reduction of the ruthenium oxide layer 62 varies depending on various factors. For example, deposition conditions of the ruthenium layer 63 such as the injection flow rates and times of a ruthenium source and reaction gas, and the thicknesses of the ruthenium oxide layer 62 and the ruthenium layer 63 can affect the degree of the chemical reduction of the ruthenium oxide layer 62.

Therefore, as shown in (c) in FIG. 6, the ruthenium oxide layer 62 can reduce completely to ruthenium by properly adjusting the factors affecting the reduction of the ruthenium oxide layer 62. In this case, only a pure ruthenium layer 64 remains on the substrate 61.

In this way, a lower portion of the pure ruthenium layer 64 is formed by reducing the ruthenium oxide layer 62. Therefore, limitations of the related art caused by a ruthenium layer directly deposited on a substrate can be solved. For example, when a ruthenium layer is deposited directly on a substrate, a blister can be formed between the ruthenium layer and the substrate due to a defective contact. However, this limitation can be removed in the present invention. Furthermore, the ruthenium oxide layer 62 used as an adhesive layer between the substrate 61 and the ruthenium layer 63 can be completely converted into ruthenium by chemical reduction to form the pure ruthenium layer 64. Therefore, a capacitor having more stable characteristics can be fabricated through subsequent processes such as a thermal process as compared with the case where the ruthenium oxide layer 62 remains between the substrate 61 and the ruthenium layer 63.

Based on the reduction of a ruthenium oxide layer explained with reference to FIG. 6, a method for fabricating a capacitor will now be described in accordance with a second embodiment of the present invention.

FIGS. 7A to 7F illustrate a method for fabricating a capacitor in accordance with a second embodiment of the present invention. In FIGS. 5A to 5G and 7A to 7F, like reference numerals denote like elements. Thus, in the following description, like elements will not be described in detail.

Figure 7A:
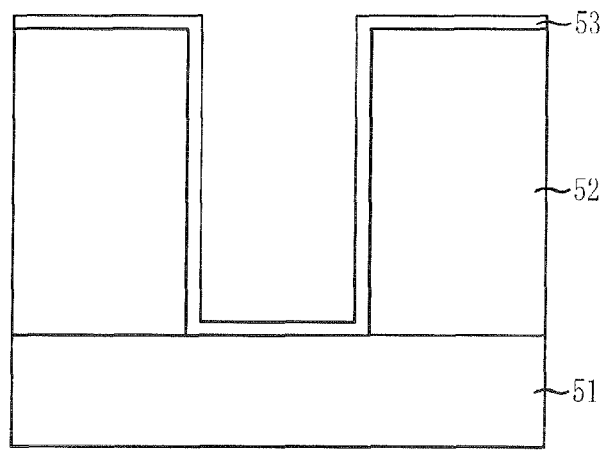
FIGS. 7A to 7F illustrate a method for fabricating a capacitor in accordance with a second embodiment of the present invention.

Referring to FIG. 7A, a mold oxide layer 52 defining a capacitor region is formed on a substrate 51 including a lower structure, and a first ruthenium oxide layer 53 is deposited on the entire surface of the substrate 51 including the mold oxide layer 52.

The first ruthenium oxide layer 53 may be deposited in the same method as described with reference to FIG. 5C except that the first ruthenium oxide layer 53 is deposited to a relatively small thickness so as to allow the first ruthenium oxide layer 53 to completely reduce to ruthenium when a lower electrode ruthenium layer 54 (shown in FIG. 7B) is deposited in a subsequent process.

Figure 7B:
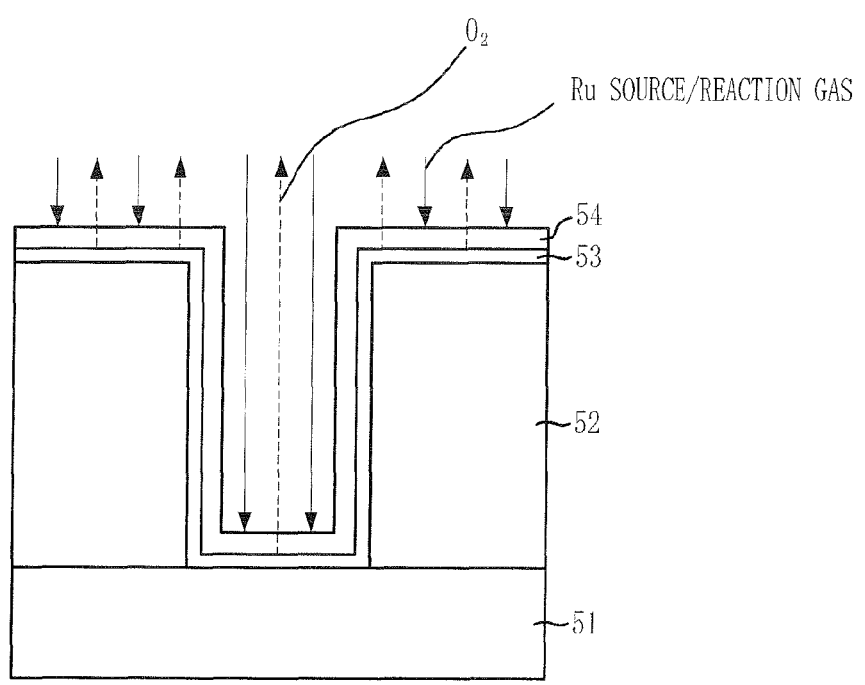

Referring to FIG. 7B, the lower electrode ruthenium layer 54 is deposited on the first ruthenium oxide layer 53. When the lower electrode ruthenium layer 54 is deposited, oxygen included in the first ruthenium oxide layer 53 is removed by reduction of the first ruthenium oxide layer 53 as explained with reference to FIG. 6.

The lower electrode ruthenium layer 54 may be deposited using the same method as described in FIG. 5D. The lower electrode ruthenium layer 54 is deposited to a thickness greater than that of the first ruthenium oxide layer 53 to allow the first ruthenium oxide layer 53 to reduce completely. Furthermore, when the lower electrode ruthenium layer 54 is deposited, the injection flow rate or injection time of a ruthenium source, and the injection flow rate or injection time of reaction gas are properly adjusted to allow the first ruthenium oxide layer 53 to reduce completely.

Figure 7C:
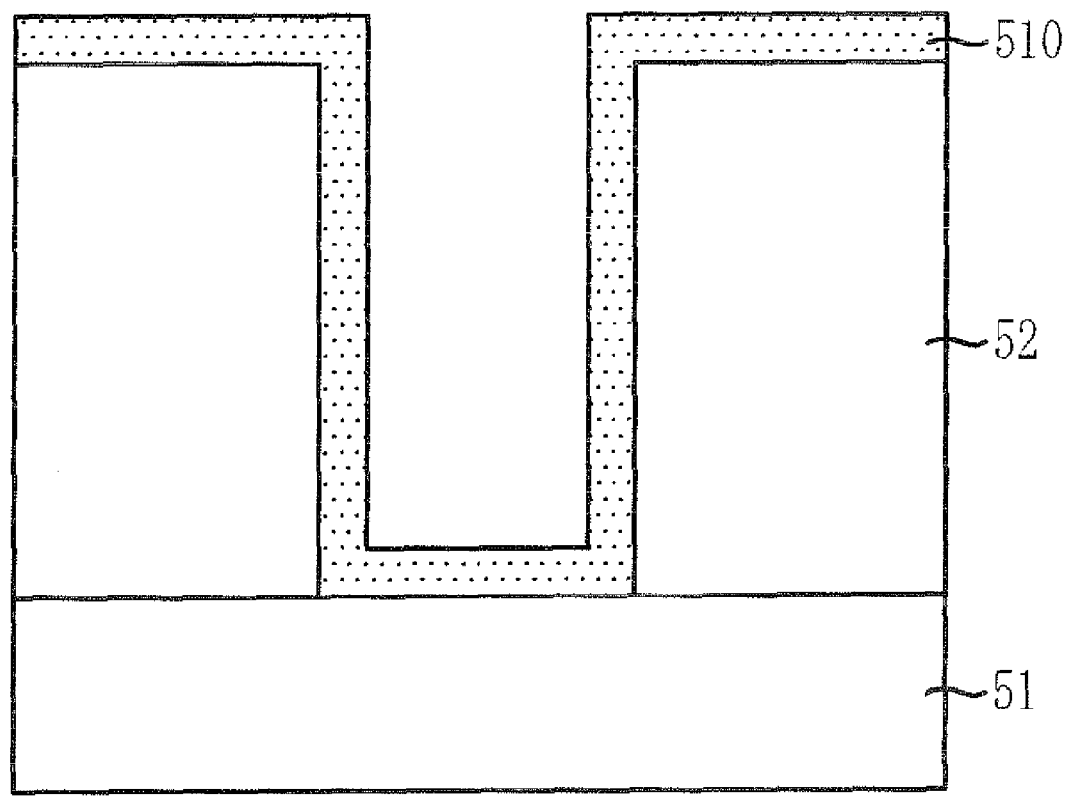

As described with reference to FIGS. 7A and 7B, the deposition conditions of the first ruthenium oxide layer 53 and the lower electrode ruthenium layer 54 are properly adjusted. Therefore, as shown in FIG. 7C, the first ruthenium oxide layer 53 reduces completely to ruthenium so that a pure ruthenium layer 510 can be formed on the substrate 51 including the mold oxide layer 52. The pure ruthenium layer 510 is used to form a lower electrode.

Although the deposition conditions of the first ruthenium oxide layer 53 and the lower electrode ruthenium layer 54 are properly adjusted, reduction of the first ruthenium oxide layer 53 can be incomplete. To deal with this situation, a heat treatment process can be performed after the lower electrode ruthenium layer 54 is deposited. For example, rapid heat treatment or furnace heat treatment can be performed in a temperature range from approximately 350° C. to approximately 600° C.

Figure 7D:
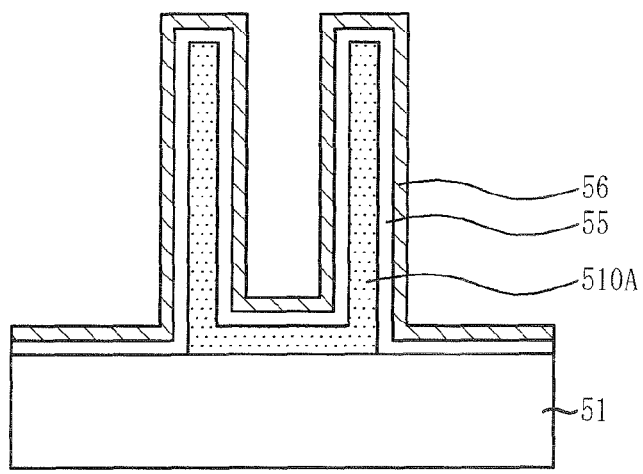

Referring to FIG. 7D, CMP or etchback is performed until the mold oxide layer 52 is exposed, so as to separate a node of the pure ruthenium layer 510 to form a lower ruthenium electrode 510A. The mold oxide layer 52 is then removed.

A dielectric layer 55 is deposited on the entire surface of the substrate 51 including the lower ruthenium electrode 510A, and a second ruthenium oxide layer 56 is deposited on the dielectric layer 55.

Figure 7E:
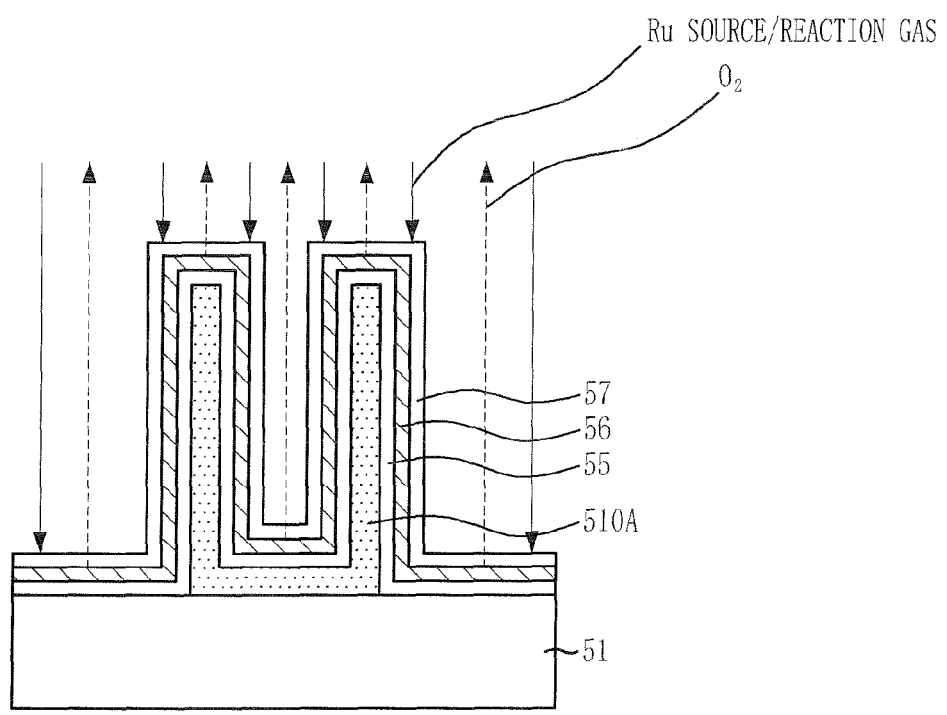

Referring to FIG. 7E, an upper electrode ruthenium layer 57 is deposited on the second ruthenium oxide layer 56. When the upper electrode ruthenium layer 57 is deposited, the second ruthenium oxide layer 56 can be completely reduced.

Figure 7F:
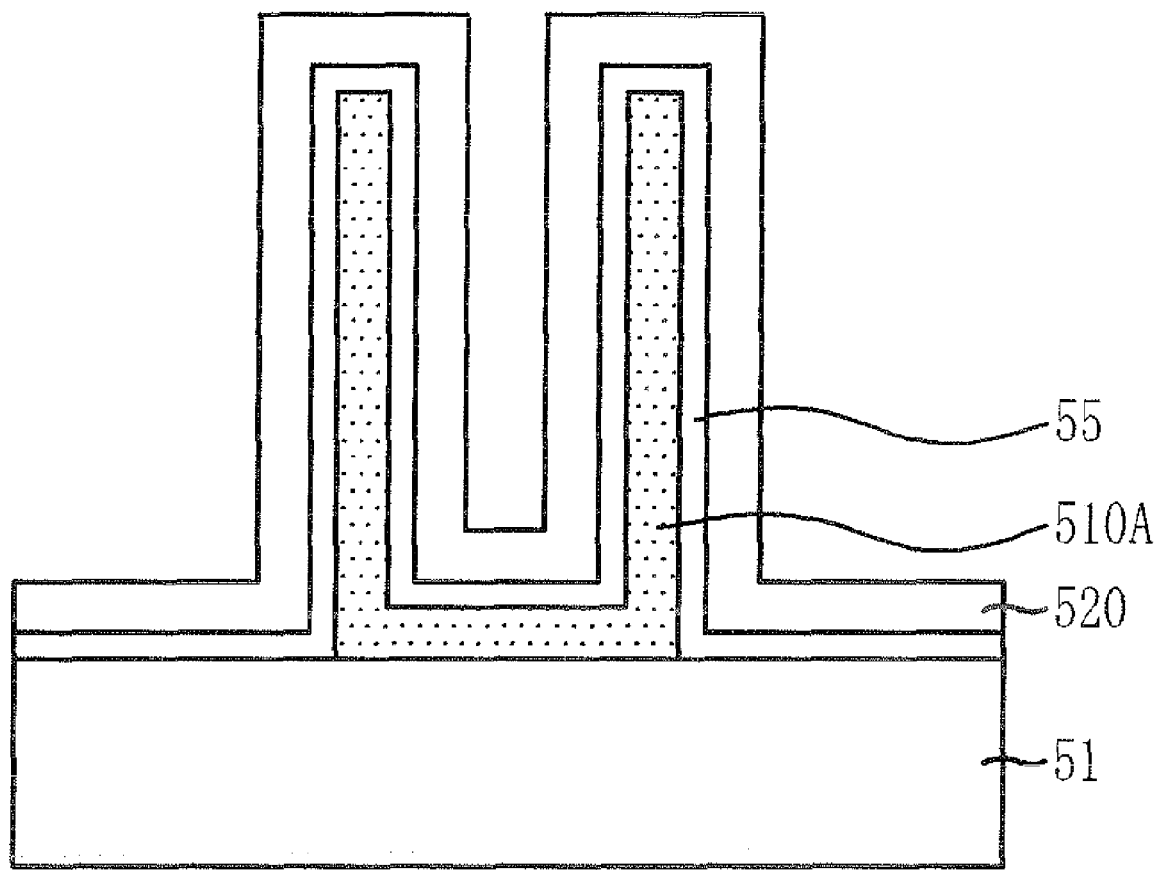

Referring to FIG. 7F, as a result of the reduction of the second ruthenium oxide layer 56, only a pure ruthenium layer 520 remains on the dielectric layer 55. The pure ruthenium layer 520 is used to form an upper electrode.

As described above, according to the method for fabricating a capacitor in accordance with the second embodiment of the present invention, the ruthenium layer can be deposited on the substrate without a defective contact. Particularly, the ruthenium oxide layer disposed under the ruthenium layer can be converted into a ruthenium layer by chemical reduction. Therefore, the characteristics of the capacitor fabricated in accordance with the second embodiment of the present invention can be stabilized.

FIG. 8 illustrates reduction of a ruthenium oxide layer when a ruthenium layer is deposited on the ruthenium oxide layer.

Referring to an upper graph in FIG. 8, results of an auger measurement for a structure in which a $SiO_2$ layer, a $ZrO_2$ layer, $RuO_2$, and a Ru layer are sequentially stacked are shown. When a sputtering time is less than approximately 20 minutes, the percentage of Ru is 95% or higher. The graph shows that a pure ruthenium (Ru) layer is formed. Specifically, when the Ru layer is deposited, the $RuO_2$ layer disposed under the Ru layer is converted into a Ru layer by chemical reduction. Therefore, a structure in which a $SiO_2$ layer, a $ZrO_2$ layer, and a Ru layer are stacked can be formed.

A lower graph in FIG. 8 shows results of X-ray diffraction measurements for a first structure in which a $SiO_2$ layer, a $ZrO_2$ layer, $RuO_2$, and a Ru layer are sequentially stacked, and a second structure in which a $SiO_2$ layer, a $ZrO_2$ layer, and a Ru layer are sequentially stacked. Referring to the lower graph of FIG. 8, the crystalline structures of the first and second structures are essentially the same. The reason for this is that when the Ru layer is deposited on the $RuO_2$ layer in the first structure, the $RuO_2$ layer reduces to Ru.

While the present invention has been described with respect to specific embodiments, the above embodiments of the present invention are illustrative and not limitative. It will be apparent to those skilled in the art that various changes and modifications may be made without departing from the spirit and scope of the invention as defined in the following claims.

What is claimed is:

1. A method for fabricating a capacitor, the method comprising:
    forming a first ruthenium oxide layer over a substrate;
    forming a lower electrode ruthenium layer for a lower electrode on the first ruthenium oxide layer;
    forming a dielectric layer over the lower electrode ruthenium layer; and
    forming an upper electrode conduction layer for an upper electrode over the dielectric layer,
    wherein forming the first ruthenium oxide layer and forming the lower electrode ruthenium layer are performed by atomic layer deposition (ALD),
    wherein each of forming the first ruthenium oxide layer and forming the lower electrode ruthenium layer comprises:
        injecting a ruthenium source into a reaction chamber at a flow rate of approximately 50 sccm to approximately 500 sccm for approximately 0.1 sec to approximately 10 sec;
        purging the reaction chamber;
        injecting a reaction gas including $O_2$ gas or $O_3$ gas into the reaction chamber at a flow rate of approximately 200 sccm to approximately 1,000 sccm for approximately 1 sec to approximately 10 sec; and
        purging the reaction chamber,
    wherein a cycle of the injecting of the ruthenium source, the purging of the reaction chamber, the injecting of the reaction gas, and the purging of the reaction chamber is repeated one or more times,
    wherein forming the lower electrode ruthenium layer comprises chemically reducing the first ruthenium oxide layer to a ruthenium layer, and
    wherein at least one of an injection flow rate or an injection time of the reaction gas for forming the first ruthenium oxide layer is greater than an injection flow rate or an injection time, respectively, of the reaction gas for forming the lower electrode ruthenium layer.

2. The method as recited in claim 1, wherein the injection flow rate or the injection time of the reaction gas for forming the first ruthenium oxide layer is two or more times greater than the injection flow rate or the injection time of the reaction gas for forming the lower electrode ruthenium layer.

3. The method as recited in claim 1, wherein forming the first ruthenium oxide layer and forming the lower electrode ruthenium layer are performed in situ.

4. The method as recited in claim 1, wherein forming the first ruthenium oxide layer and forming the lower electrode ruthenium layer are performed in a temperature range from approximately 200 C.° to approximately 400 C.° or at a pressure ranging from approximately 3 torr to approximately 4 torr.

5. The method as recited in claim 1, wherein purging the reaction chamber is performed by injecting $N_2$ gas into the reaction chamber at a flow rate of approximately 100 sccm to approximately 900 sccm for approximately 1 sec to approximately 5 sec, and wherein an injection flow rate or an injection time of the $O_2$ gas for forming the first ruthenium oxide layer is greater than an injection flow rate or an injection time of the $O_2$ gas for forming the lower electrode ruthenium layer.

6. The method as recited in claim 1, wherein the reaction gas further comprises one or more of $H_2O$, $NH_3$, and $H_2$ gases.

7. The method as recited in claim 1, wherein when the lower electrode ruthenium layer is formed on the first ruthenium oxide layer, the first ruthenium oxide layer is reduced to a ruthenium layer by adjusting at least one of an injection flow rate or an injection time of the ruthenium source for forming the lower electrode ruthenium layer, the injection flow rate or the injection time of the reaction gas for forming the lower electrode ruthenium layer, and a thickness of the first ruthenium oxide layer or a thickness of the lower electrode ruthenium layer.

8. The method as recited in claim 7, wherein the thickness of the first ruthenium oxide layer is smaller than the thickness of the lower electrode ruthenium layer.

9. The method as recited in claim 1, further comprising performing a heat treatment process after forming the lower electrode ruthenium layer.

10. The method as recited in claim 9, wherein the heat treatment process is performed by rapid heat treatment or furnace heat treatment in a temperature range from approximately 350 C.° to approximately 600 C.°.

11. The method as recited in claim 1, wherein the upper electrode conduction layer comprises a ruthenium layer, wherein forming the upper electrode conduction layer comprises:
forming a second ruthenium oxide layer over the dielectric layer; and
forming an upper electrode ruthenium layer for the upper electrode on the second ruthenium oxide layer.

12. The method as recited in claim 11, wherein forming the upper electrode ruthenium layer comprises chemically reducing the second ruthenium oxide layer to a ruthenium layer.

13. The method as recited in claim 11, wherein forming the second ruthenium oxide layer and forming the upper electrode ruthenium layer are performed by atomic layer deposition (ALD).

14. The method as recited in claim 13, wherein each of forming the second ruthenium oxide layer and forming the upper electrode ruthenium layer comprises:
injecting a ruthenium source into a reaction chamber;
purging the reaction chamber;
injecting a reaction gas into the reaction chamber; and
purging the reaction chamber,
wherein a cycle of injecting the ruthenium source, purging the reaction chamber, injecting the reaction gas, and purging the reaction chamber is repeated one or more times,
wherein an injection flow rate or an injection time of the reaction gas for forming the second ruthenium oxide layer is greater than an injection flow rate or an injection time of the reaction gas for forming the upper electrode ruthenium layer.

15. The method as recited in claim 14, wherein the injection flow rate or the injection time of the reaction gas for forming the second ruthenium oxide layer is two or more times greater than the injection flow rate or the injection time of the reaction gas for forming the upper electrode ruthenium layer.

16. The method as recited in claim 13, wherein forming the second ruthenium oxide layer and forming the upper electrode ruthenium layer are performed in situ.

17. The method as recited in claim 13, wherein forming the second ruthenium oxide layer and forming the upper electrode ruthenium layer are performed in a temperature range from approximately 200 C.° to approximately 400 C.° or at a pressure ranging from approximately 3 torr to approximately 4 torr.

18. The method as recited in claim 14, wherein injecting the ruthenium source is performed by injecting the ruthenium source into the reaction chamber at a flow rate of approximately 50 sccm to approximately 500 sccm for approximately 0.1 sec to approximately 10 sec, purging the reaction chamber is performed by injecting $N_2$ gas into the reaction chamber at a flow rate of approximately 100 sccm to approximately 900 sccm for approximately 1 sec to approximately 5 sec, and injecting the reaction gas is performed by injecting $O_2$ gas into the reaction chamber at a flow rate of approximately 200 sccm to approximately 1,000 sccm for approximately 1 sec to approximately 10 sec, wherein an injection flow rate or an injection time of the $O_2$ gas for forming the second ruthenium oxide layer is greater than an injection flow rate or an injection time of the $O_2$ gas for forming the upper electrode ruthenium layer.

19. The method as recited in claim 14, wherein the reaction gas comprises $O_2$ gas or $O_3$ gas.

20. The method as recited in claim 19, wherein the reaction gas further comprises one selected from a group consisting of $H_2O$, $NH_3$, $H_2$ gases, and a combination thereof.

21. The method as recited in claim 14, wherein when the upper electrode ruthenium layer is formed on the second ruthenium oxide layer, the second ruthenium oxide layer is reduced to a ruthenium layer by adjusting at least one of an injection flow rate or an injection time of the ruthenium source for forming the upper electrode ruthenium layer, the injection flow rate or the injection time of the reaction gas for forming the upper electrode ruthenium layer, or a thickness of the second ruthenium oxide layer or a thickness of the upper electrode ruthenium layer.

22. The method as recited in claim 21, wherein the thickness of the second ruthenium oxide layer is smaller than the thickness of the upper electrode ruthenium layer.

23. The method as recited in claim 11, further comprising performing a heat treatment process after forming the upper electrode ruthenium layer.

24. The method as recited in claim 23, wherein the heat treatment process is performed by rapid heat treatment or furnace heat treatment in a temperature range from approximately 350 C.° to approximately 600 C.°.

* * * * *